(12) United States Patent
Pagaila et al.

(10) Patent No.: US 8,349,735 B2
(45) Date of Patent: Jan. 8, 2013

(54) SEMICONDUCTOR DEVICE AND METHOD OF FORMING CONDUCTIVE TSV WITH INSULATING ANNULAR RING

(75) Inventors: Reza A. Pagaila, Singapore (SG); Byung Tai Do, Singapore (SG); Nathapong Suthiwongsunthorn, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 290 days.

(21) Appl. No.: 12/887,811

(22) Filed: Sep. 22, 2010

(65) Prior Publication Data

US 2012/0068313 A1 Mar. 22, 2012

(51) Int. Cl.
*H01L 21/44* (2006.01)
(52) U.S. Cl. ........ 438/667; 438/639; 438/672; 257/621; 257/734
(58) Field of Classification Search .......... 257/621, 257/774, E21.597, E23.011; 438/639, 667, 438/672, 675
See application file for complete search history.

(56) References Cited

U.S. PATENT DOCUMENTS

| | | | |
|---|---|---|---|
| 6,037,822 A * | 3/2000 | Rao et al. | 327/298 |
| 6,908,856 B2 | 6/2005 | Beyne et al. | |
| 7,157,372 B1 | 1/2007 | Trezza | |
| 7,402,515 B2 * | 7/2008 | Arana et al. | 438/639 |
| 2005/0121768 A1 * | 6/2005 | Edelstein et al. | 257/698 |
| 2007/0281460 A1 | 12/2007 | Trezza | |
| 2009/0127667 A1 * | 5/2009 | Iwata | 257/621 |
| 2009/0140436 A1 | 6/2009 | Wang | |

* cited by examiner

*Primary Examiner* — Phuc Dang
(74) *Attorney, Agent, or Firm* — Robert D. Atkins; Atkins & Associates, P.C.

(57) ABSTRACT

A semiconductor wafer has an insulating layer formed over an active surface of the wafer. A conductive layer is formed over the insulating layer. A first via is formed from a back surface of the semiconductor wafer through the semiconductor wafer and insulating layer to the conductive layer. A conductive material is deposited in the first via to form a conductive TSV. An insulating material can be deposited in the first via to form an insulating core within the conductive via. After forming the conductive TSV, a second via is formed around the conductive TSV from the back surface of the semiconductor wafer through the semiconductor wafer and insulating layer to the conductive layer. An insulating material is deposited in the second via to form an insulating annular ring. The conductive via can be recessed within or extend above a surface of the semiconductor die.

25 Claims, 20 Drawing Sheets

SEMICONDUCTOR DEVICE AND METHOD OF FORMING CONDUCTIVE TSV WITH INSULATING ANNULAR RING

FIELD OF THE INVENTION

The present invention relates in general to semiconductor devices and, more particularly, to a semiconductor device and method of forming a conductive TSV with an insulating annular ring.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1 shows a conventional semiconductor wafer 10 with a plurality of semiconductor die 12 formed on the wafer separated by saw streets 14. An insulating or dielectric layer 16 is formed over active surface 18. An electrically conductive layer 20 is formed over insulating layer 16. Conductive layer 20 operates as contact pads for electrical connection to external circuits. An insulating or passivation layer 22 is formed over insulating layer 16 and conductive layer 20.

FIG. 2 illustrates a portion of conventional semiconductor die 12. A plurality of vias is formed through the base semiconductor material of die 12 and insulating layer 16. An insulating material is first formed on the sidewalls of the vias as an insulating ring 24. After forming insulating ring 24, the remaining via area is then filled with electrically conductive material over insulating ring 24 to form z-direction vertical conductive through silicon vias (TSV) 26.

FIGS. 3a-3d illustrates another conventional conductive TSV with an insulating ring. In FIG. 3a, a plurality of vias 28 is formed through the base semiconductor material of die 12 and insulating layer 16. An insulating material is first deposited into vias 28 to form insulating ring 30, as shown in FIG. 3b. In FIG. 3c, vias 32 are cut to remove the base semiconductor material within or inside insulating ring 30 and insulating layer 16 down to conductive layer 20. After forming insulating ring 30, the remaining via area 32 is then filled with electrically conductive material to form z-direction vertical conductive TSV 34, as shown in FIG. 3d. Conductive TSV 34 are electrically connected to conductive layer 20.

In each case, the insulating ring is deposited prior to the conductive TSV. Consequently, the insulating material accumulates on the exposed conductive layer 20 during deposition. The insulating material must be removed or cleaned from the TSV contact area of conductive layer 20 prior to filling the vias with the conductive material to ensure good electrical contact. The process of removing insulating residue from the TSV contact area of conductive layer 20 is time consuming and adds manufacturing cost. Failure to properly remove insulating layer 24 from the TSV contact area of conductive layer 20 causes high contact resistant and defects in semiconductor die 12.

SUMMARY OF THE INVENTION

A need exists to form a conductive TSV with an insulating ring without leaving insulating material residue on the underlying conductive layer. Accordingly, in one embodiment, the present invention is a method of making a semiconductor device comprising the steps of providing a semiconductor wafer, forming an insulating layer over an active surface of the semiconductor wafer, forming a conductive layer over the insulating layer, forming a first via from a back surface of the semiconductor wafer, opposite the active surface, through the semiconductor wafer and insulating layer to the conductive layer, depositing a conductive material in the first via to form a conductive TSV, after forming the conductive TSV, forming a second via around the conductive TSV from the back surface of the semiconductor wafer through the semiconductor wafer and insulating layer to the conductive layer, and depositing a first insulating material in the second via to form an insulating annular ring.

In another embodiment, the present invention is a method of making a semiconductor device comprising the steps of providing a semiconductor wafer, forming a first via through the semiconductor wafer, depositing a conductive material in the first via to form a conductive via, after forming the conductive via, forming a second via around the conductive via through the semiconductor wafer, and depositing a first insulating material in the second via to form an insulating ring.

In another embodiment, the present invention is a method of making a semiconductor device comprising the steps of providing a semiconductor die, forming a first via through the semiconductor die, depositing a conductive material in the first via to form a conductive via, forming a second via outside the conductive via through the semiconductor die, and depositing a first insulating material in the second via to form an insulating ring.

In another embodiment, the present invention is a semiconductor device comprising a semiconductor die and conductive via formed through the semiconductor die. An insulating ring is formed outside the conductive via through the semiconductor die.

DETAILED DESCRIPTION OF THE DRAWINGS

Figure 1:
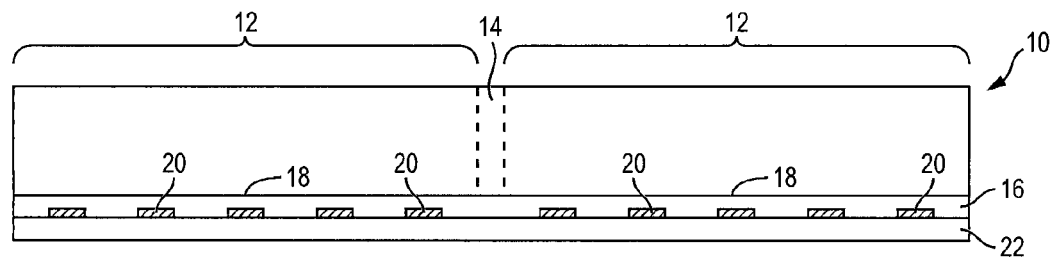
FIG. 1 illustrates a conventional semiconductor wafer with a plurality of semiconductor die separated by a saw street.
Figure 2:
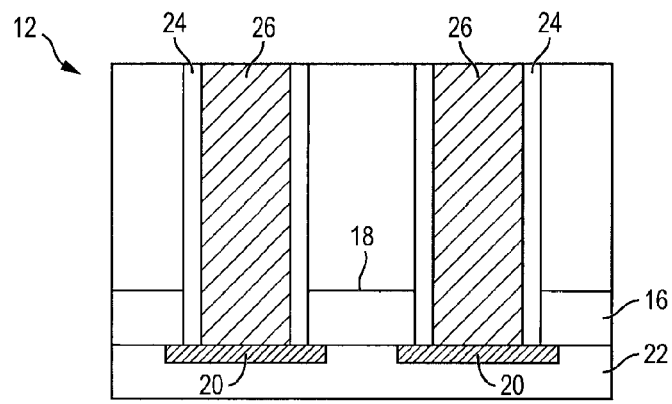
FIG. 2 illustrates a conventional conductive TSV with an insulating ring formed through the semiconductor die.
Figure 3A:
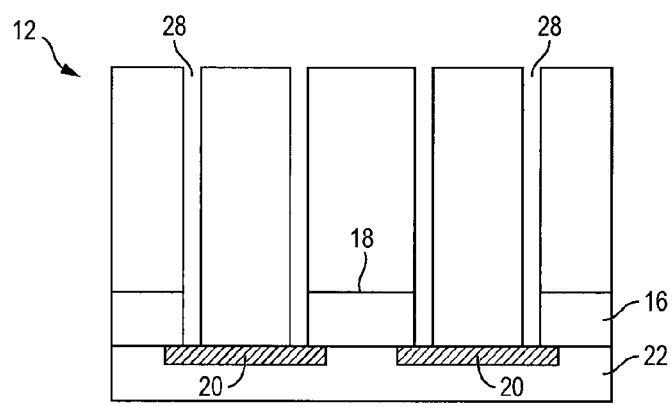
FIGS. 3a-3d illustrate another conventional conductive TSV with an insulating ring formed through the semiconductor die.
Figure 3B:
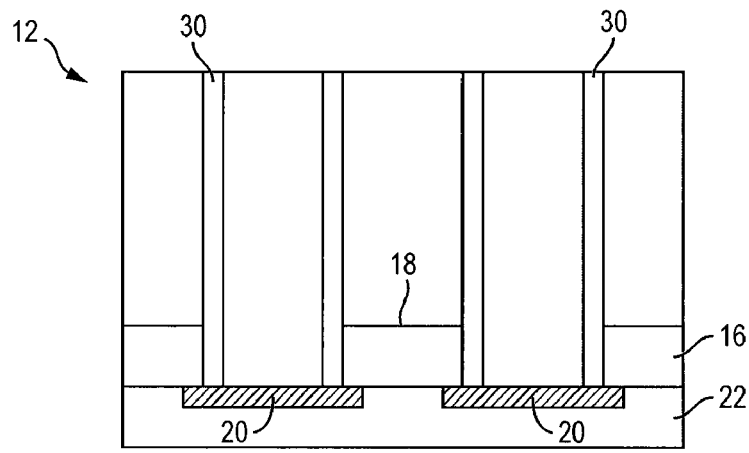
Figure 3C:
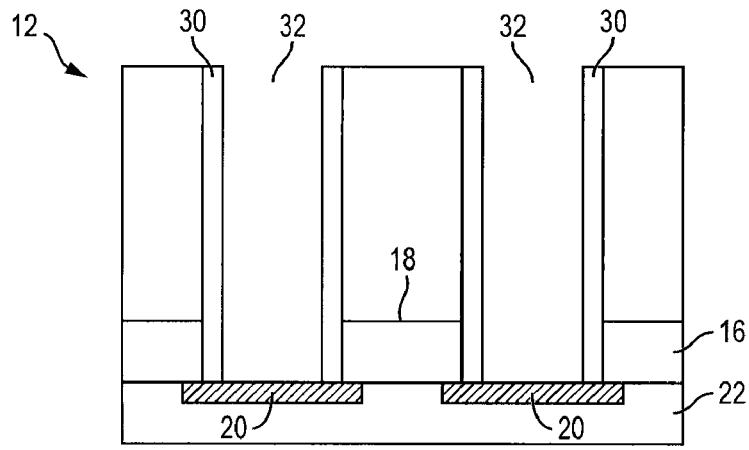
Figure 3D:
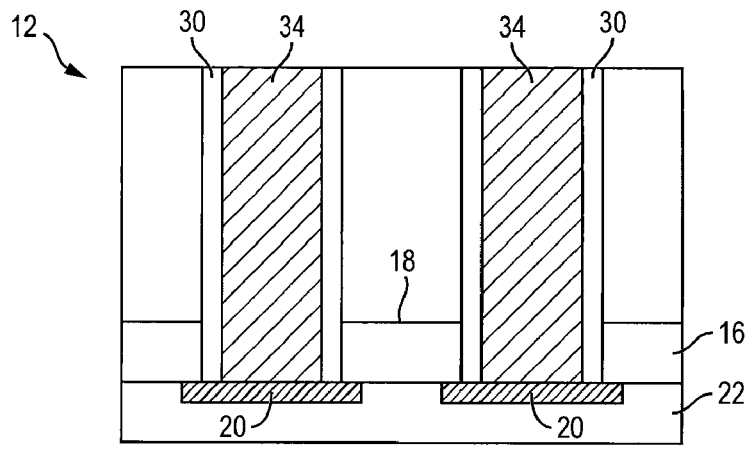

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes. The wafer is singulated using a laser cutting tool or saw blade.

After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 4:
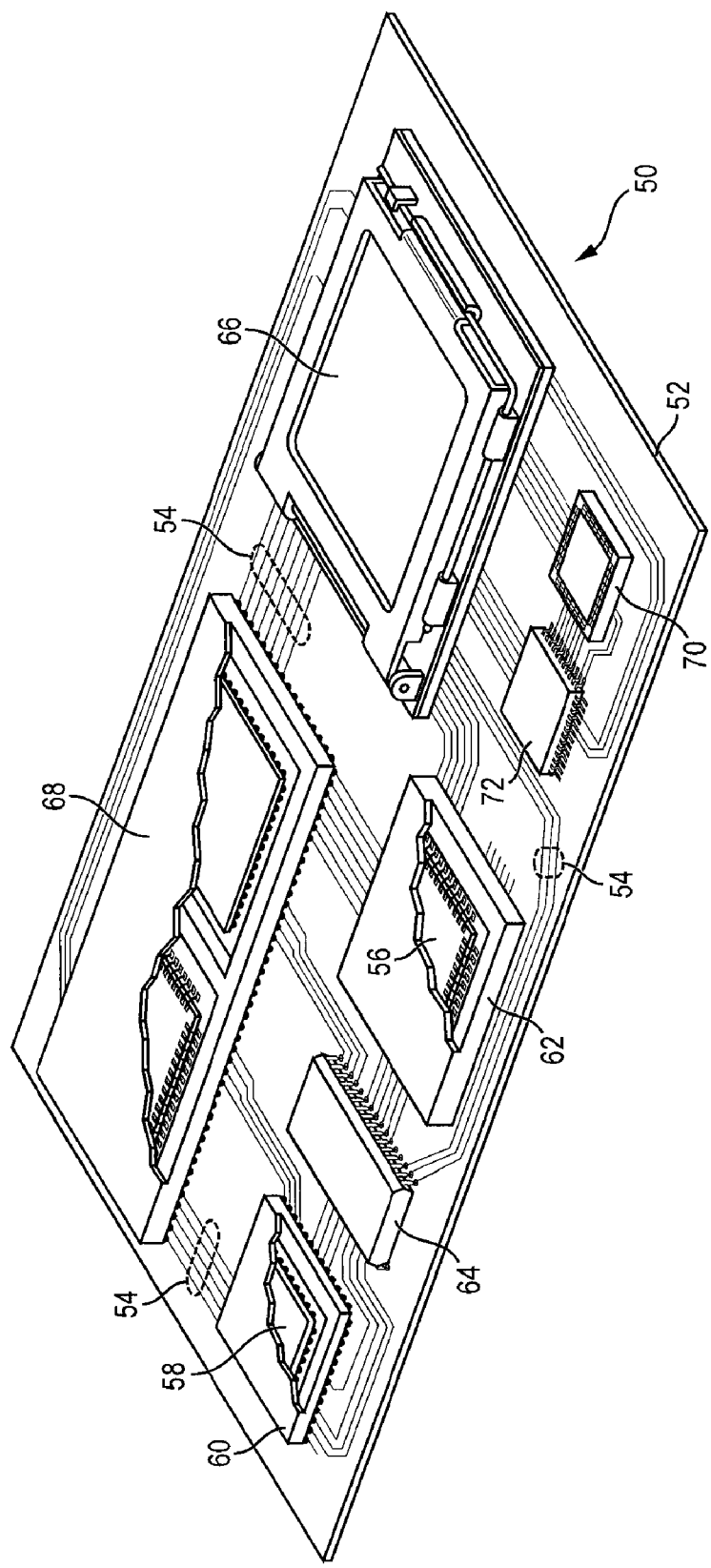
FIG. 4 illustrates a PCB with different types of packages mounted to its surface.

FIG. 4 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 4 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 4, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 5A:
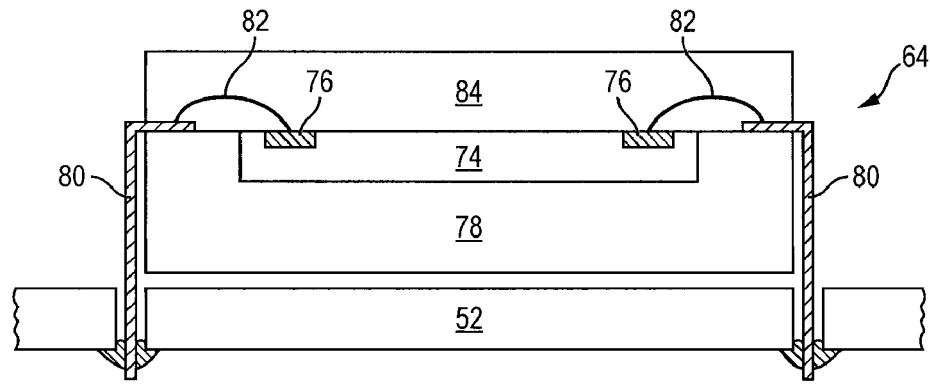
FIGS. 5a-5c illustrate further detail of the representative semiconductor packages mounted to the PCB.
Figure 5B:
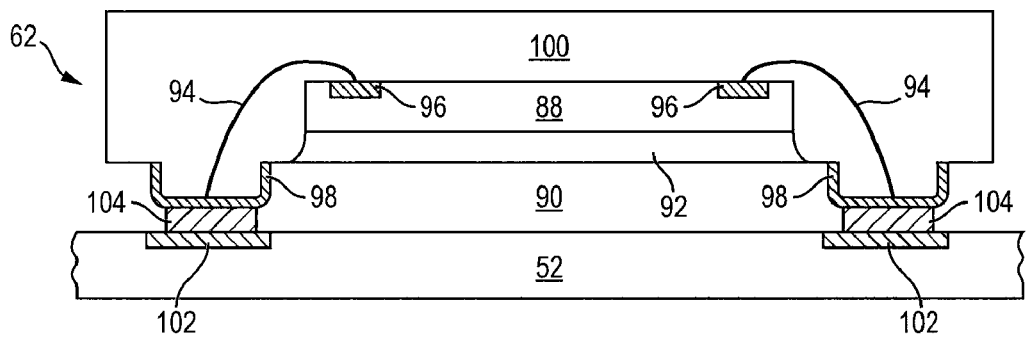
Figure 5C:
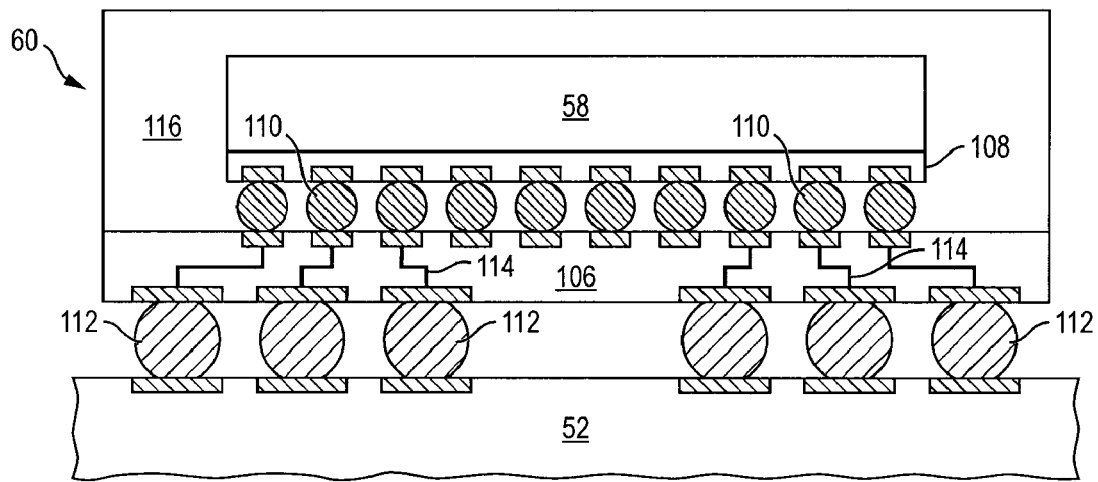

FIGS. 5a-5c show exemplary semiconductor packages. FIG. 5a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 5b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 5c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 6A:
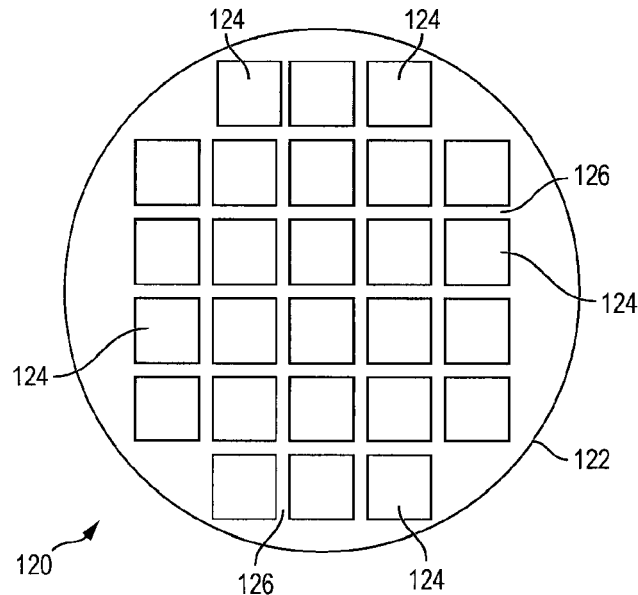
FIGS. 6a-6c illustrate a semiconductor wafer with a plurality of semiconductor die separated by a saw street.

FIG. 6a shows, in relation to FIGS. 4 and 5a-5c, a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 6B:
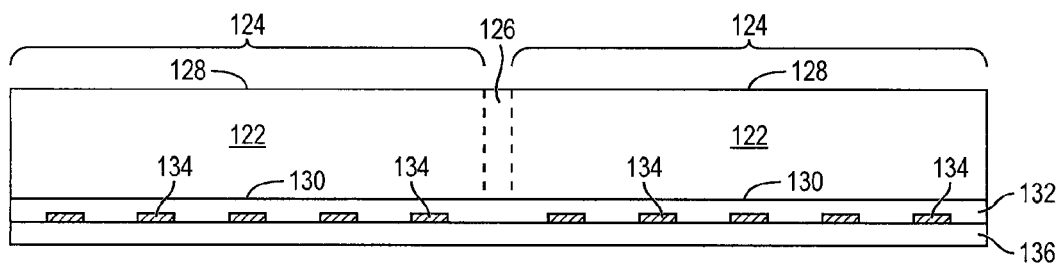

FIG. 6b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An insulating or dielectric layer 132 is formed over active surface 130 using PVD, CVD, screen printing, spin coating, spray coating, sintering, or thermal oxidation. The insulating layer 132 contains one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable dielectric material.

An electrically conductive layer 134 is formed over insulating layer 132 using PVD, CVD, electrolytic plating, electroless plating process, or other suitable metal deposition process. Conductive layer 134 can be one or more layers of Al, Cu, Sn, Ni, Au, Ag, or other suitable electrically conductive material. Conductive layer 134 operates as contact pads for electrical connection to external circuits.

An insulating or passivation layer 136 is formed over insulating layer 132 and conductive layer 134 using PVD, CVD, screen printing, spin coating, spray coating, sintering, or thermal oxidation. The insulating layer 136 contains one or more layers of SiO2, Si3N4, SiON, Ta2O5, Al2O3, or other material having similar insulating and structural properties.

Figure 6C:
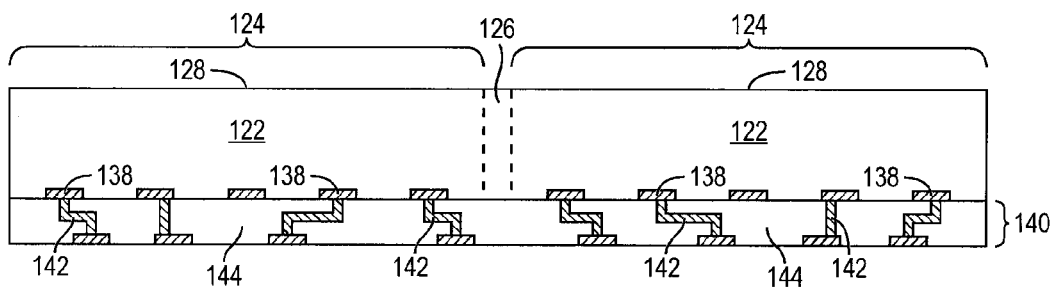

FIG. 6c shows another embodiment with an electrically conductive layer 138 formed over active surface 130 using PVD, CVD, electrolytic plating, electroless plating process, or other suitable metal deposition process. Conductive layer 138 can be one or more layers of Al, Cu, Sn, Ni, Au, Ag, or other suitable electrically conductive material. Conductive layer 138 operates as contact pads electrically connected to the circuits on active surface 130.

A build-up interconnect structure 140 is formed over active surface 130 of semiconductor die 124. The build-up interconnect structure 140 includes an electrically conductive layer or redistribution layer (RDL) 142 formed using a patterning and metal deposition process such as sputtering, electrolytic plating, and electroless plating. Conductive layer 142 can be one or more layers of Al, Cu, Sn, Ni, Au, Ag, or other suitable electrically conductive material. One portion of conductive layer 142 is electrically connected to contact pads 138. Other portions of conductive layer 142 can be electrically common or electrically isolated depending on the design and function of semiconductor die 124.

An insulating or passivation layer 144 is formed around conductive layer 142 for electrical isolation using PVD, CVD, screen printing, spin coating, spray coating, sintering, or thermal oxidation. The insulating layer 144 contains one or more layers of SiO2, Si3N4, SiON, Ta2O5, Al2O3, or other material having similar insulating and structural properties.

Figure 7A:
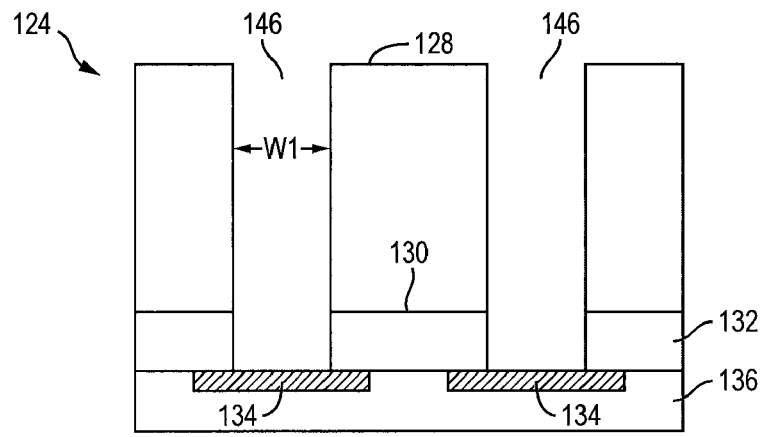
FIGS. 7a-7f illustrate a process of forming a conductive TSV with an insulating annular ring.

FIGS. 7a-7f illustrate a portion of semiconductor die 124 with a conductive TSV and insulating annular ring formed through the semiconductor die. In FIG. 7a, a plurality of vias 146 is formed from back surface 128, opposite active surface 130, through semiconductor die 124 and insulating layer 132 while in wafer form using laser drilling, mechanical drilling, or deep reactive ion etching (DRIE) with mask. The vias 146 extend through insulating layer 132 to conductive layer 134. In one embodiment, vias 146 have a diameter or width W1 of 50-80 micrometers (µm).

Figure 7B:
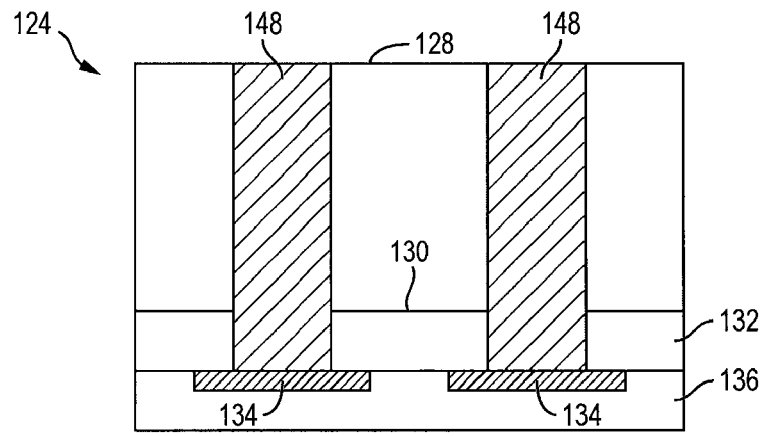

In FIG. 7b, vias 146 are filled with Al, Cu, Sn, Ni, Au, Ag, Ti, W, or other suitable electrically conductive material using electrolytic plating, electroless plating process, or other suitable metal deposition process to form z-direction vertical conductive TSV 148. Conductive TSV 148 is electrically connected to conductive layer 134.

Figure 7C:
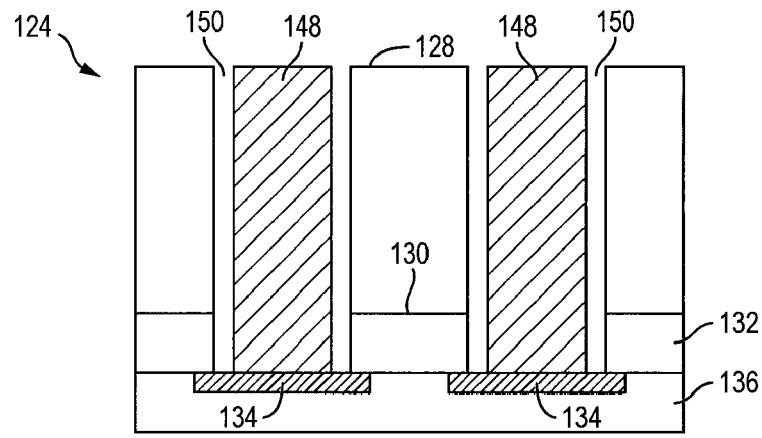
Figure 7D:
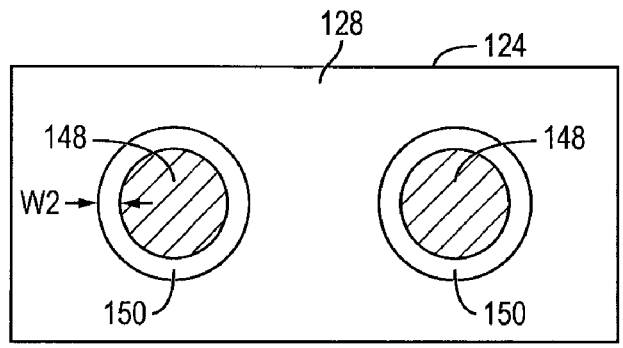

In FIG. 7c, after filling vias 146 with conductive material to form conductive TSV 148, vias 150 are formed from back surface 128 through semiconductor die 124 and insulating layer 132 using laser drilling, mechanical drilling, or DRIE with mask. In particular, vias 150 are formed around a periphery or outside of conductive TSV 148 as annular holes extending down to conductive layer 134, as shown in FIG. 7d. In one embodiment, vias 150 have a width W2 of 10-25 µm between conductive TSV 148 and base semiconductor material 122.

Figure 7E:
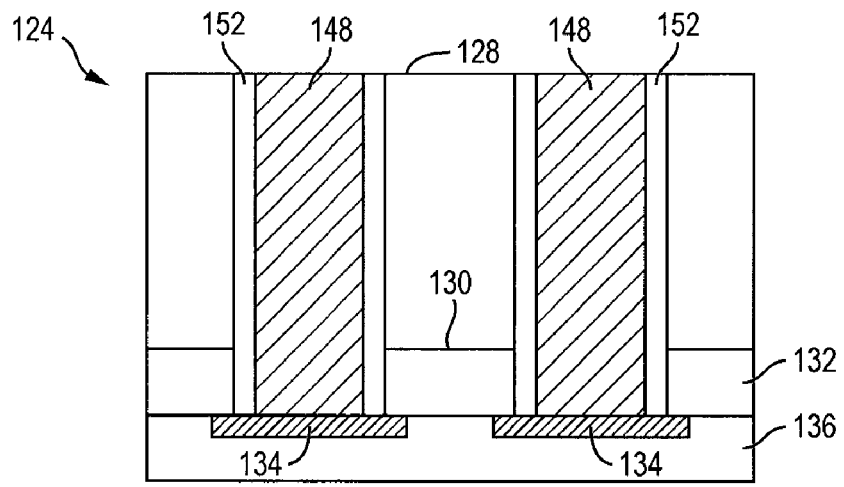
Figure 7F:
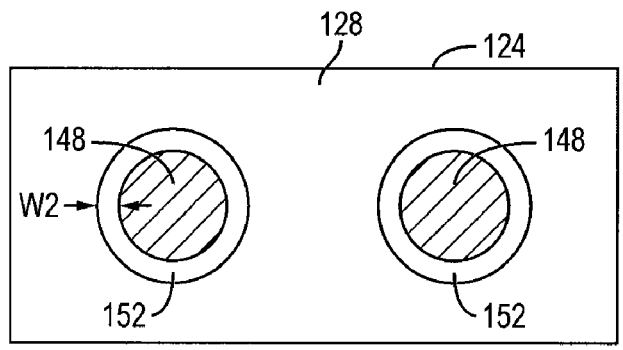

In FIG. 7e, an insulating or dielectric material is deposited into vias 150 using PVD, CVD, screen printing, sintering, or thermal oxidation to form an insulating annular ring 152. The insulating material can be one or more layers of SiO2, Si3N4, SiON, Ta2O5, Al2O3, polyimide, BCB, PBO, or other suitable dielectric material. FIG. 7f shows a plan view of insulating annular ring 152 formed around the periphery or outside of conductive TSV 148. The insulating annular ring 152 has a low dielectric constant (k) to electrically isolate conductive TSV 148 with low contact resistance and low capacitance. The low-k insulating annular ring 152 reduces thermal and mechanical stress on conductive TSV 148. In addition, there is no insulating material residue or need to clean the TSV contact area of conductive layer 134 after forming insulating annular ring 152 because conductive TSV 148 has already been formed over conductive layer 134. Forming conductive TSV 148 prior to forming insulating annular ring 152 saves manufacturing cost. The insulating annular ring 152 can be formed with substantially no voids.

Figure 8A:
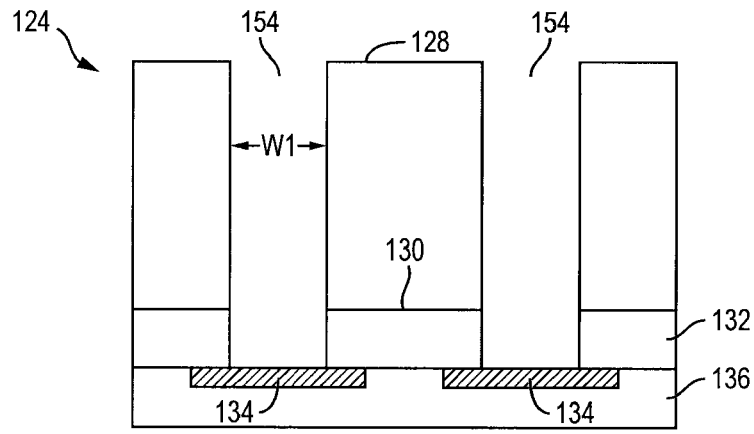
FIGS. 8a-8g illustrate the conductive TSV with a conformal conductive lining and insulating annular ring.

FIGS. 8a-8g illustrate another embodiment of the conductive TSV with an insulating annular ring. A plurality of vias 154 is formed from back surface 128, opposite active surface 130, through semiconductor die 124 and insulating layer 132 while in wafer form using laser drilling, mechanical drilling, or DRIE with mask, as shown in FIG. 8a. The vias 154 extend through insulating layer 132 to conductive layer 134. In one embodiment, vias 154 have a diameter or width W1 of 50-80 µm.

Figure 8B:
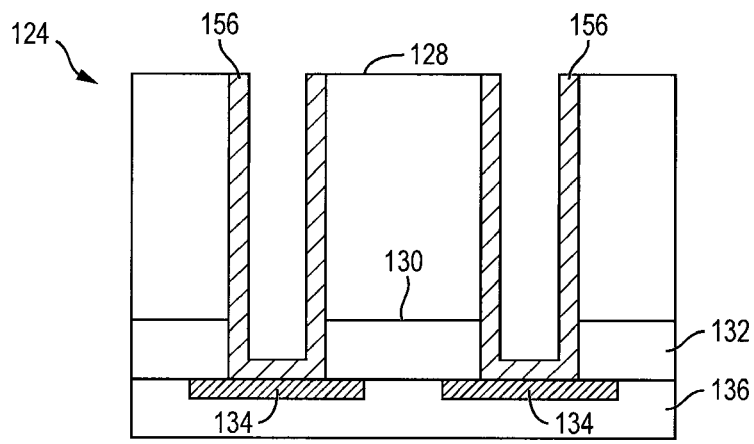

In FIG. 8b, an electrically conductive material 156, such as Al, Cu, Sn, Ni, Au, Ag, Ti, or W, is conformally deposited over the sidewalls of vias 154 using electrolytic plating, electroless plating process, or other suitable metal deposition process to form z-direction vertical conductive TSV 156. Conductive TSV 156 is electrically connected to conductive layer 134.

Figure 8C:
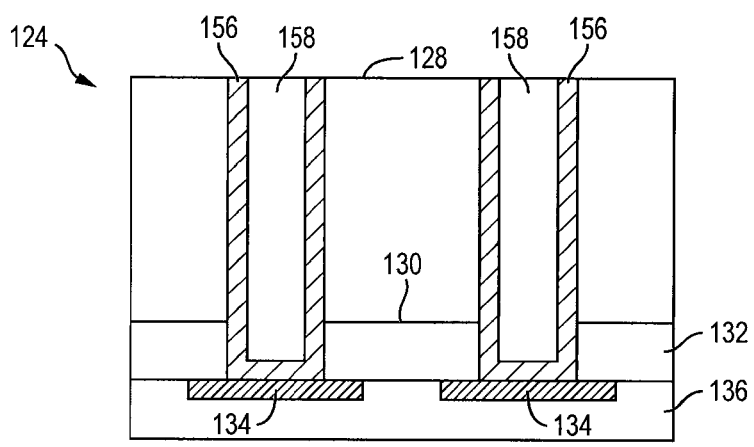

In FIG. 8c, the remaining portion of vias 154 is filled with an insulating or dielectric material using PVD, CVD, screen printing, sintering, or thermal oxidation to form an insulating core 158. The insulating core 158 can be one or more layers of SiO2, Si3N4, SiON, Ta2O5, Al2O3, polyimide, BCB, PBO, or other suitable dielectric material. The insulating core 158 provides thermal and mechanical stress relief for conductive TSV 156.

Figure 8D:
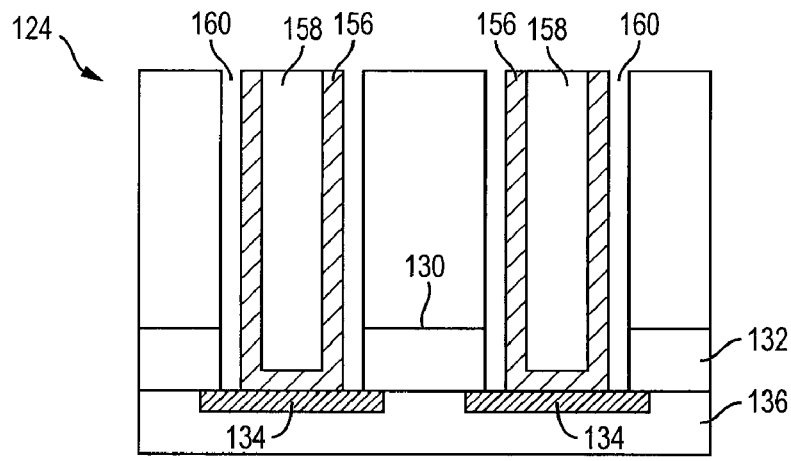
Figure 8E:
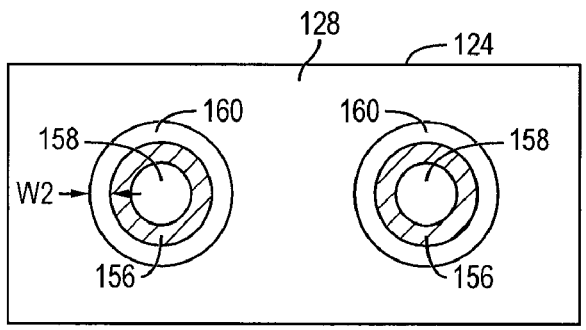

In FIG. 8*d*, after forming conductive TSV 156 and insulating core 158 in vias 154, vias 160 are formed from back surface 128 through semiconductor die 124 and insulating layer 132 using laser drilling, mechanical drilling, or DRIE with mask. In particular, vias 160 are formed around a periphery or outside of conductive TSV 156 and insulating core 158 as annular holes extending down to conductive layer 134. In one embodiment, vias 160 have a width W2 of 10-25 μm between insulating core 158 and base semiconductor material 122. FIG. 8*e* shows a plan view of vias 160, conductive TSV 156, and insulating core 158.

Figure 8F:
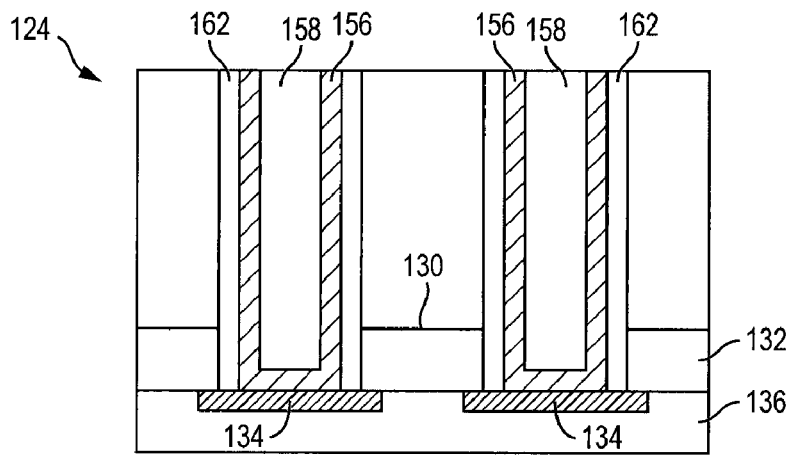

In FIG. 8*f*, an insulating or dielectric material is deposited into vias 160 using PVD, CVD, screen printing, sintering, or thermal oxidation to form an insulating annular ring 162. The insulating material can be one or more layers of SiO2, Si3N4, SiON, Ta2O5, Al2O3, polyimide, BCB, PBO, or other suitable dielectric material.

Figure 8G:
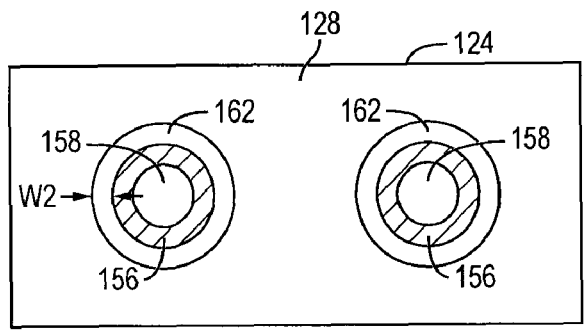

FIG. 8*g* shows a plan view of insulating annular ring 162 formed around the periphery or outside of conductive TSV 156 and insulating core 158. The insulating annular ring 162 has a low k to electrically isolate conductive TSV 156 with low contact resistance and low capacitance. The low-k insulating annular ring 162 and insulating core 158 reduce thermal and mechanical stress on conductive TSV 156. In addition, there is no insulating material residue or need to clean the TSV contact area of conductive layer 134 after forming insulating annular ring 162 because conductive TSV 156 has already been formed over conductive layer 134. Forming conductive TSV 156 prior to forming insulating annular ring 162 saves manufacturing cost. The insulating annular ring 162 can be formed with substantially no voids.

Figure 9A:
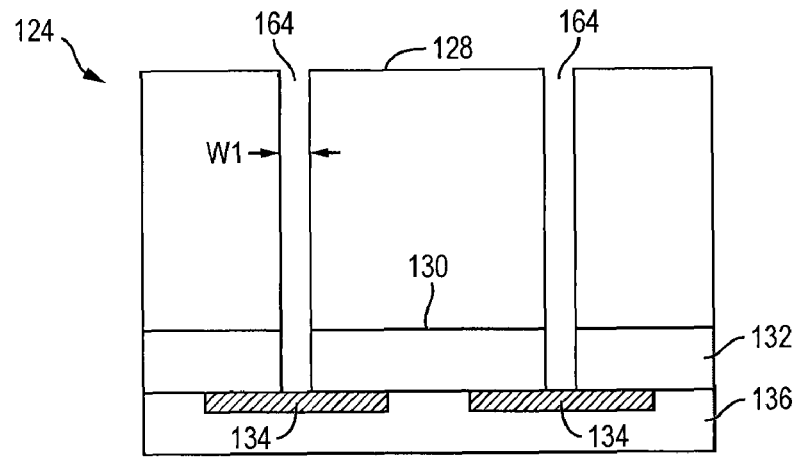
FIGS. 9a-9f illustrate a small conductive TSV with a larger insulating annular ring.

FIGS. 9*a*-9*f* illustrate another embodiment of the conductive TSV with an insulating annular ring. A plurality of vias 164 is formed from back surface 128, opposite active surface 130, through semiconductor die 124 and insulating layer 132 while in wafer form using laser drilling, mechanical drilling, or DRIE with mask, as shown in FIG. 9*a*. The vias 164 extend through insulating layer 132 to conductive layer 134. In one embodiment, vias 164 have a diameter or width W1 of 20-40 μm.

Figure 9B:
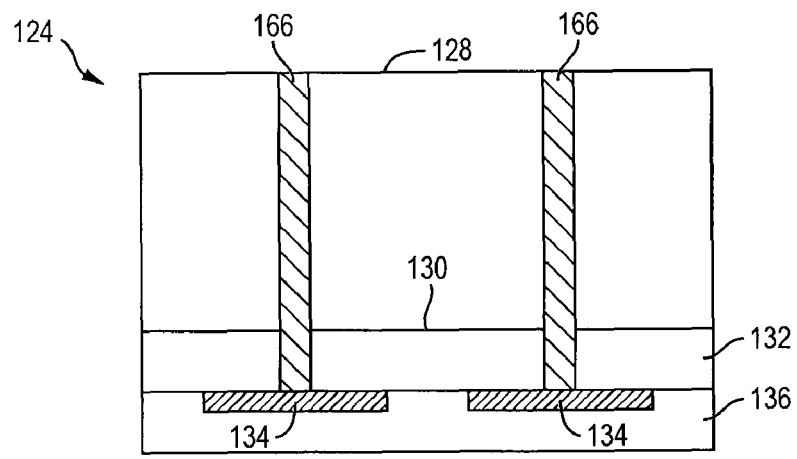

In FIG. 9*b*, vias 164 are filled with Al, Cu, Sn, Ni, Au, Ag, Ti, W, or other suitable electrically conductive material using electrolytic plating, electroless plating process, or other suitable metal deposition process to form z-direction vertical conductive TSV 166. The smaller vias 164 allow for faster deposition of the conductive material. Conductive TSV 166 is electrically connected to conductive layer 134.

Figure 9C:
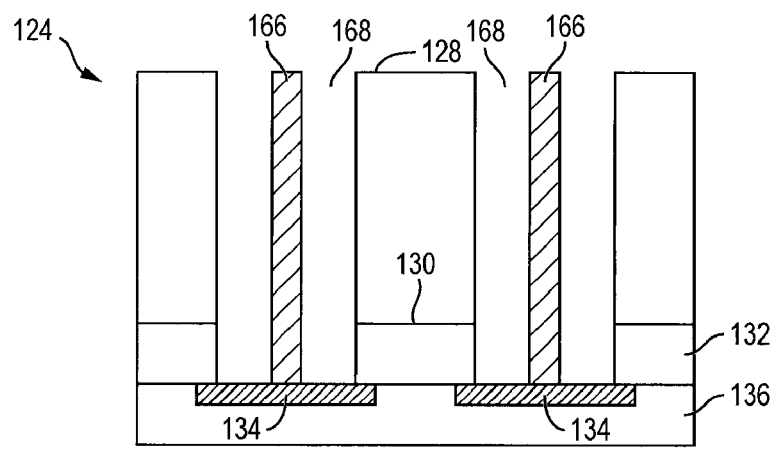
Figure 9D:
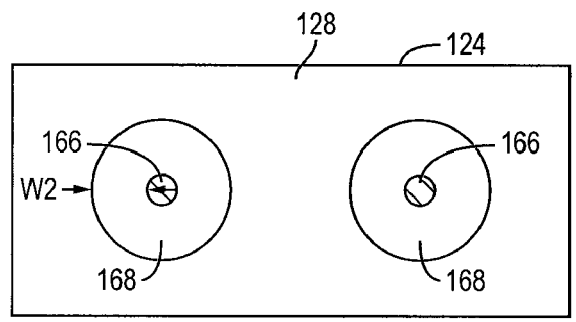

In FIG. 9*c*, after filling vias 164 with conductive material to form conductive TSV 166, vias 168 are formed from back surface 128 through semiconductor die 124 and insulating layer 132 using laser drilling, mechanical drilling, or DRIE with mask. In particular, vias 168 are formed around a periphery or outside of conductive TSV 166 as an annular hole extending down to conductive layer 134, as shown in FIG. 9*d*. In one embodiment, vias 168 have a width W2 of 30-50 μm between conductive TSV 166 and base semiconductor material 122, which is greater than width W1 of conductive TSV 166.

Figure 9E:
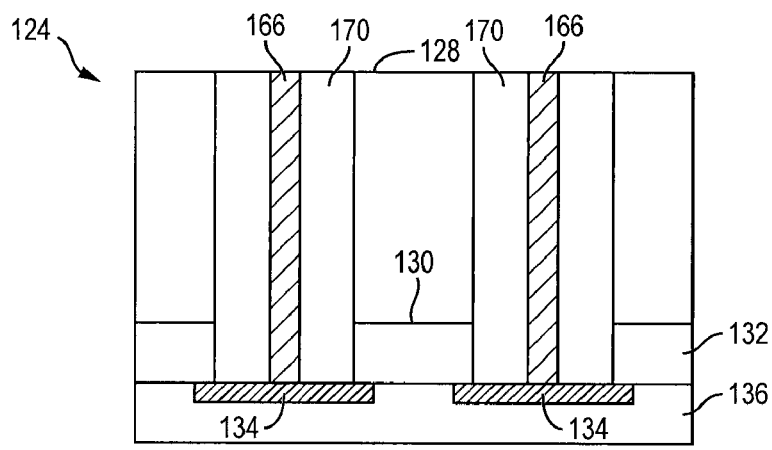

In FIG. 9*e*, an insulating or dielectric material is deposited into vias 168 using PVD, CVD, screen printing, spin coating, sintering, or thermal oxidation to form an insulating annular ring 170. The insulating material can be one or more layers of SiO2, Si3N4, SiON, Ta2O5, Al2O3, polyimide, BCB, PBO, or other suitable dielectric material. The larger width of vias 168 allows for spin coating as an option to deposit polymer type insulating material.

Figure 9F:
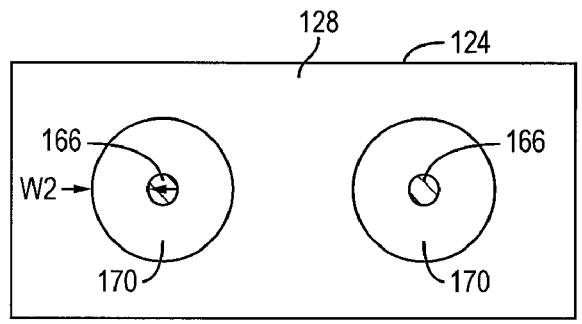

FIG. 9*f* shows a plan view of insulating annular ring 170 formed around the periphery or outside of conductive TSV 166. The insulating annular ring 170 has a low k to electrically isolate conductive TSV 166 with low contact resistance and low capacitance. The low-k insulating annular ring 170 reduces thermal and mechanical stress on conductive TSV 166. In addition, there is no insulating material residue or need to clean the TSV contact area of conductive layer 134 after forming insulating annular ring 170 because conductive TSV 166 has already been formed over conductive layer 134. Forming conductive TSV 166 prior to forming insulating annular ring 170 saves manufacturing cost. The insulating annular ring 170 can be formed with substantially no voids.

Figure 10A:
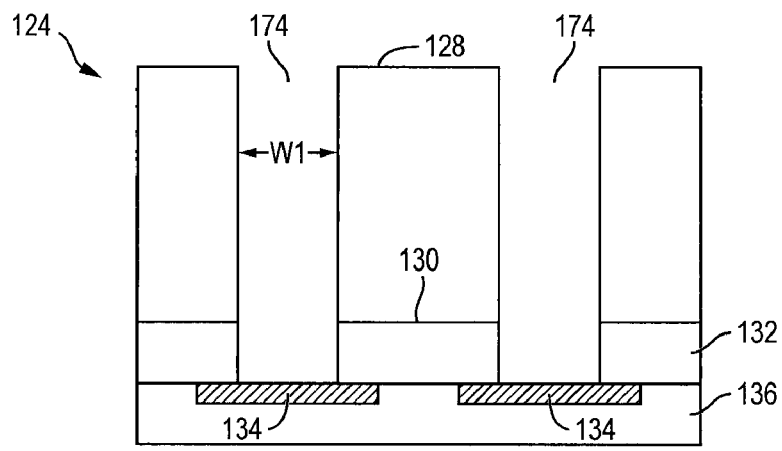
FIGS. 10a-10f illustrate a protruding conductive TSV with an insulating annular ring.

FIGS. 10*a*-10*f* illustrate another embodiment of the conductive TSV with an insulating annular ring. A plurality of vias 174 is formed from back surface 128, opposite active surface 130, through semiconductor die 124 and insulating layer 132 while in wafer form using laser drilling, mechanical drilling, or DRIE with mask, as shown in FIG. 10*a*. The vias 174 extend through insulating layer 132 to conductive layer 134. In one embodiment, vias 174 have a diameter or width W1 of 50-80 μm.

Figure 10B:
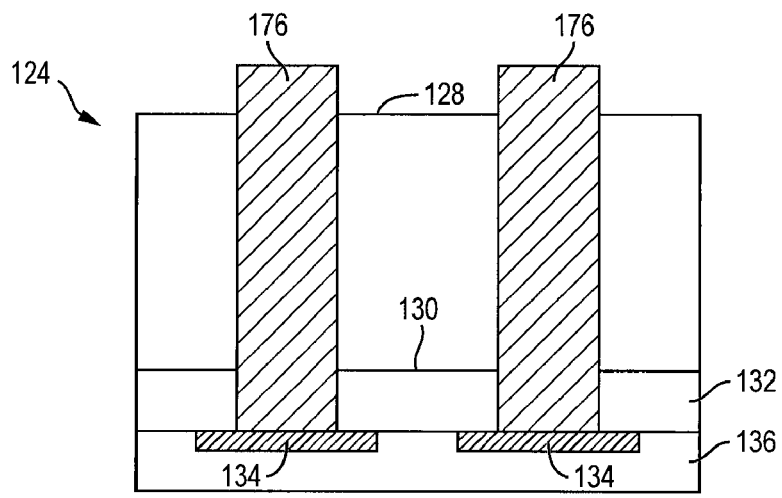

In FIG. 10*b*, vias 174 are filled with Al, Cu, Sn, Ni, Au, Ag, Ti, W, or other suitable electrically conductive material using electrolytic plating, electroless plating process, or other suitable metal deposition process to form z-direction vertical conductive TSV 176. In this case, conductive TSV 176 extends above back surface 128. The protruding conductive TSV 176 enable semiconductor die 124 to be mounted directly on contact pads of a stacked device or substrate. Conductive TSV 176 is electrically connected to conductive layer 134.

Figure 10C:
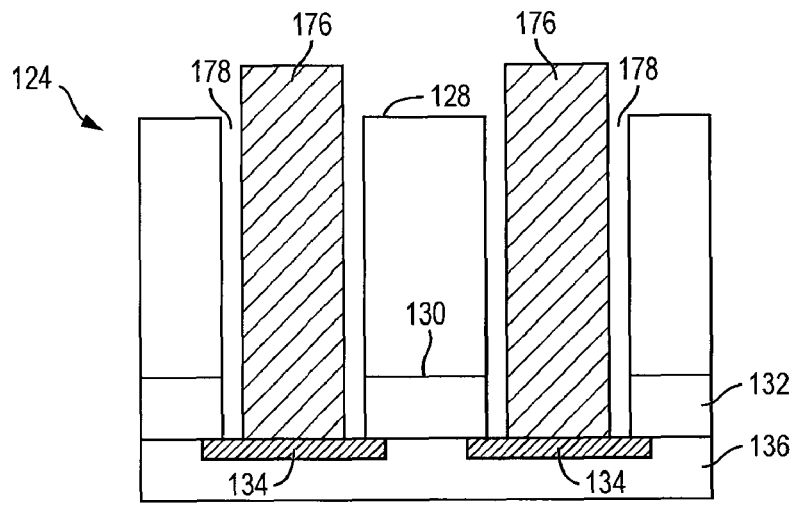
Figure 10D:
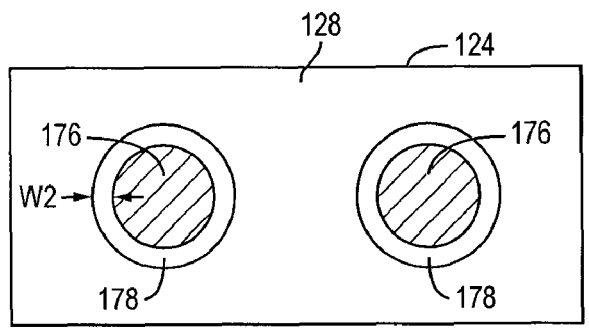

In FIG. 10*c*, after filling vias 174 with conductive material to form conductive TSV 176, vias 178 are formed from back surface 128 through semiconductor die 124 and insulating layer 132 using laser drilling, mechanical drilling, or DRIE with mask. In particular, vias 178 are formed around a periphery or outside of conductive TSV 176 as an annular hole extending down to conductive layer 134, as shown in FIG. 10*d*. In one embodiment, vias 178 have a width W2 of 10-25 μm between conductive TSV 176 and base semiconductor material 122.

Figure 10E:
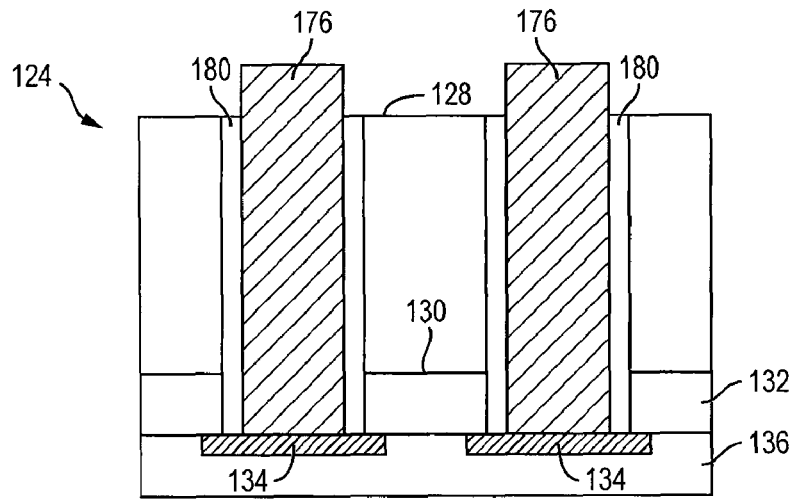

In FIG. 10*e*, an insulating or dielectric material is deposited into vias 178 using PVD, CVD, screen printing, sintering, thermal oxidation, or combination of masking and CVD to form an insulating annular ring 180. The insulating material can be one or more layers of SiO2, Si3N4, SiON, Ta2O5, Al2O3, polyimide, BCB, PBO, or other suitable dielectric material.

Figure 10F:
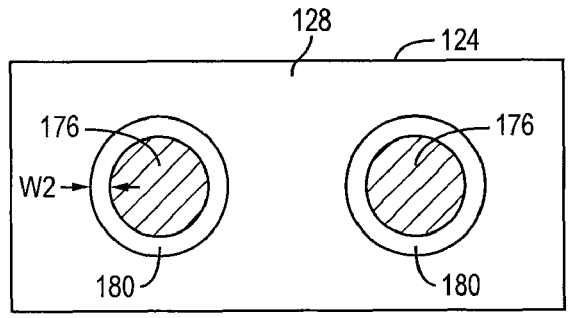

FIG. 10*f* shows a plan view of insulating annular ring 180 formed around the periphery or outside of conductive TSV 176. The insulating annular ring 180 has a low k to electrically isolate conductive TSV 176 with low contact resistance and low capacitance. The low-k insulating annular ring 180 reduces thermal and mechanical stress on conductive TSV 176. In addition, there is no insulating material residue or need to clean the TSV contact area of conductive layer 134 after forming insulating annular ring 180 because conductive TSV 176 has already been formed over conductive layer 134. Forming conductive TSV 176 prior to forming insulating annular ring 180 saves manufacturing cost. The insulating annular ring 180 can be formed with substantially no voids.

Figure 11A:
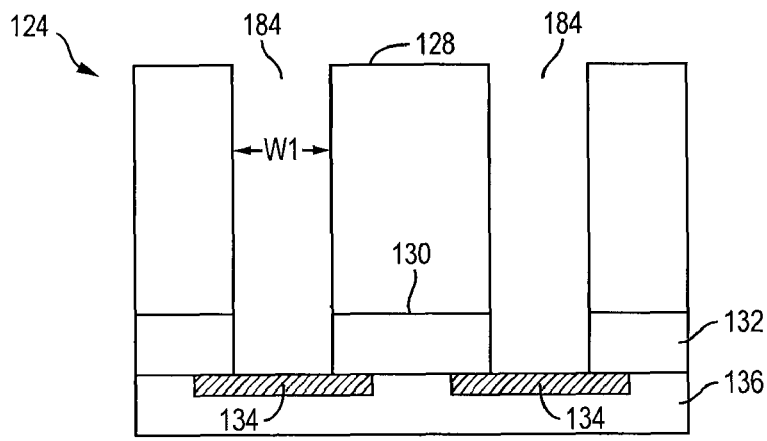
FIGS. 11a-11g illustrate a recessed conductive TSV with an insulating annular ring.

FIGS. 11a-11g illustrate another embodiment of the conductive TSV with an insulating annular ring. A plurality of vias 184 is formed from back surface 128, opposite active surface 130, through semiconductor die 124 and insulating layer 132 while in wafer form using laser drilling, mechanical drilling, or DRIE with mask, as shown in FIG. 11a. The vias 184 extend through insulating layer 132 to conductive layer 134. In one embodiment, vias 184 have a diameter or width W1 of 50-80 µm.

Figure 11B:
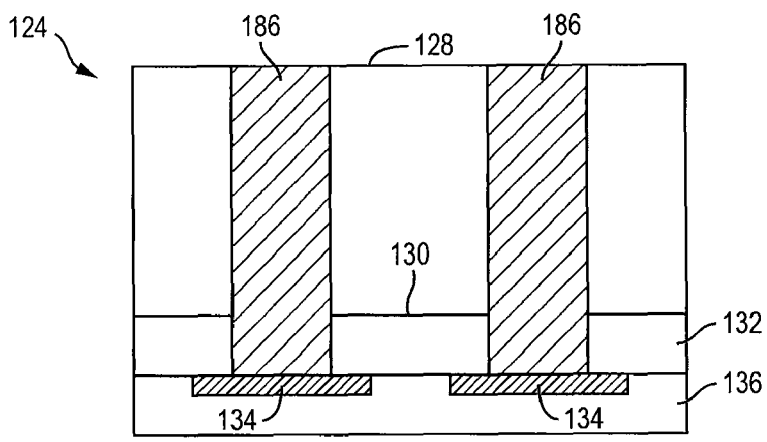

In FIG. 11b, vias 184 are filled with Al, Cu, Sn, Ni, Au, Ag, Ti, W, or other suitable electrically conductive material using electrolytic plating, electroless plating process, or other suitable metal deposition process to form z-direction vertical conductive TSV 186. Conductive TSV 186 is electrically connected to conductive layer 134.

Figure 11C:
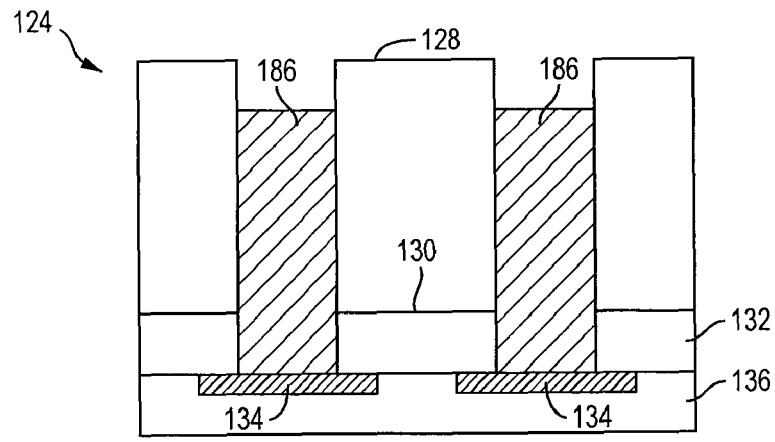

In FIG. 11c, a portion of conductive TSV 186 is removed by an etching process such that the top surface of conductive TSV 186 is below back surface 128. The recessed conductive TSV 186 allow for mounting of a contact plug, such as a bump, to reduce the height of semiconductor die 124.

Figure 11D:
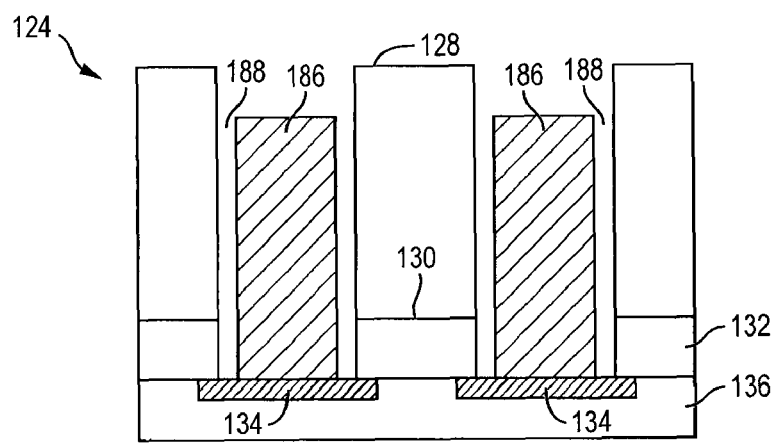
Figure 11E:
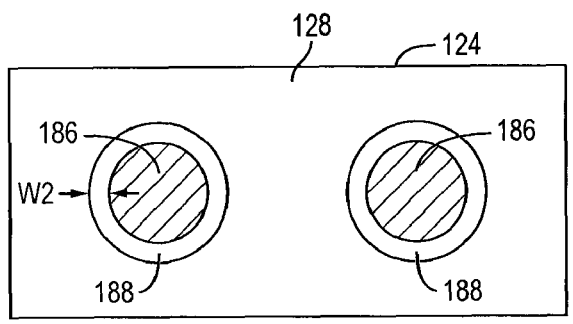

In FIG. 11d, after filling vias 184 with conductive material to form conductive TSV 186 and etching back the conductive TSV below back surface 128, vias 188 are formed from the back surface through semiconductor die 124 and insulating layer 132 using laser drilling, mechanical drilling, or DRIE with mask. In particular, vias 188 are formed around a periphery or outside of conductive TSV 186 as an annular hole extending down to conductive layer 134, as shown in FIG. 11e. In one embodiment, vias 188 have a width W2 of 10-25 µm between conductive TSV 186 and base semiconductor material 122.

Figure 11F:
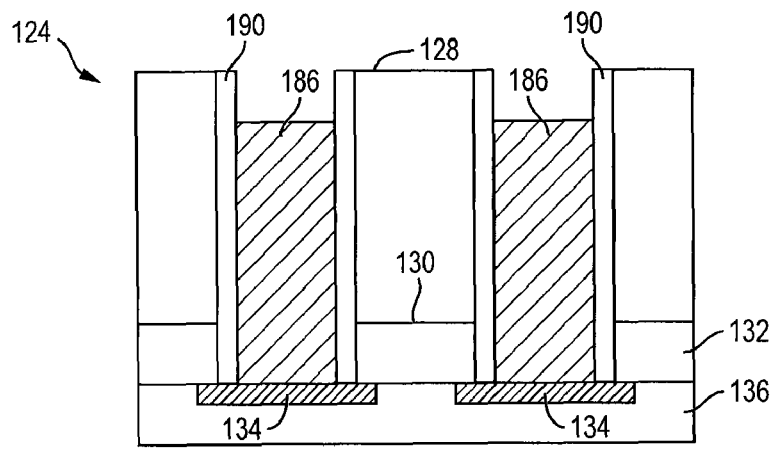

In FIG. 11f, an insulating or dielectric material is deposited into vias 188 using PVD, CVD, screen printing, sintering, thermal oxidation, or combination of masking and CVD to form an insulating annular ring 190. The insulating material can be one or more layers of SiO2, Si3N4, SiON, Ta2O5, Al2O3, polyimide, BCB, PBO, or other suitable dielectric material.

Figure 11G:
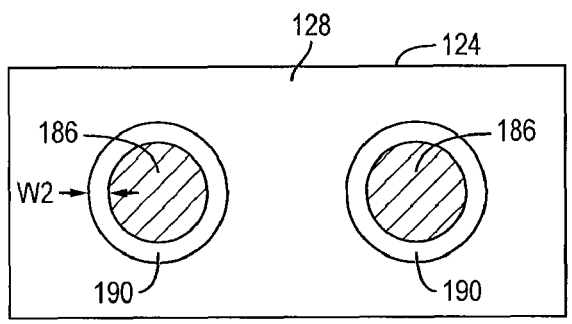

FIG. 11g shows a plan view of insulating annular ring 190 formed around the periphery or outside of conductive TSV 186. The insulating annular ring 190 has a low k to electrically isolate conductive TSV 186 with low contact resistance and low capacitance. The low-k insulating annular ring 190 reduces thermal and mechanical stress on conductive TSV 186. In addition, there is no insulating material residue or need to clean the TSV contact area of conductive layer 134 after forming insulating annular ring 190 because conductive TSV 186 has already been formed over conductive layer 134. Forming conductive TSV 186 prior to forming insulating annular ring 190 saves manufacturing cost. The insulating annular ring 190 can be formed with substantially no voids.

Figure 12A:
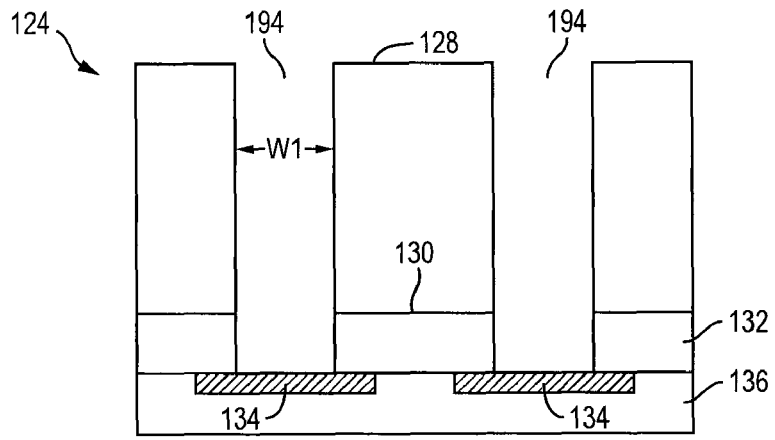
FIGS. 12a-12f illustrate a conductive TSV with an insulating annular ring terminating at the active surface of the semiconductor die.

FIGS. 12a-12f illustrate another embodiment of the conductive TSV with an insulating annular ring. A plurality of vias 194 is formed from back surface 128, opposite active surface 130, through semiconductor die 124 and insulating layer 132 while in wafer form using laser drilling, mechanical drilling, or DRIE with mask, as shown in FIG. 12a. The vias 194 extend through insulating layer 132 to conductive layer 134. In one embodiment, vias 194 have a diameter or width W1 of 50-80 µm.

Figure 12B:
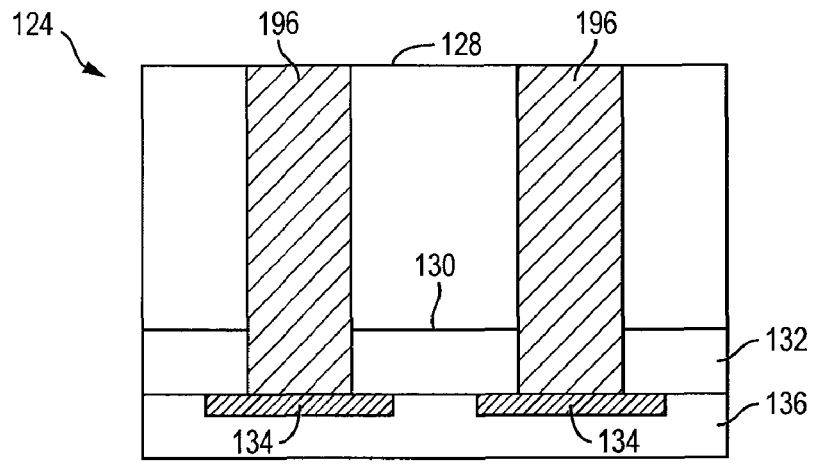

In FIG. 12b, vias 194 are filled with Al, Cu, Sn, Ni, Au, Ag, Ti, W, or other suitable electrically conductive material using electrolytic plating, electroless plating process, or other suitable metal deposition process to form z-direction vertical conductive TSV 196. Conductive TSV 196 is electrically connected to conductive layer 134.

Figure 12C:
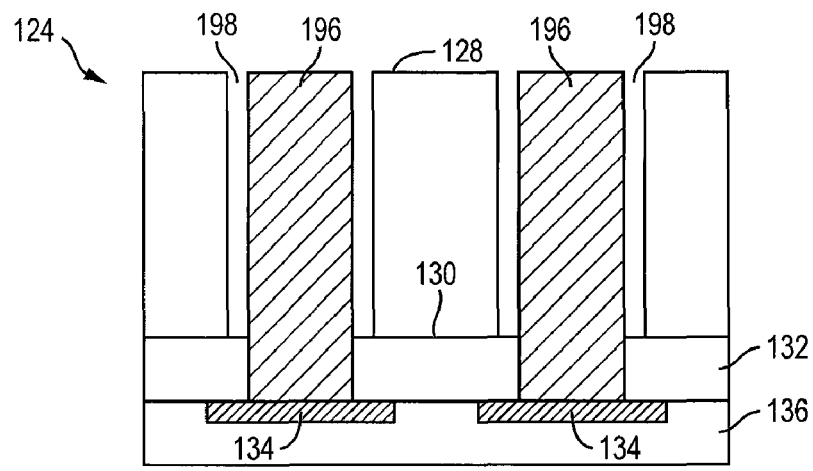
Figure 12D:
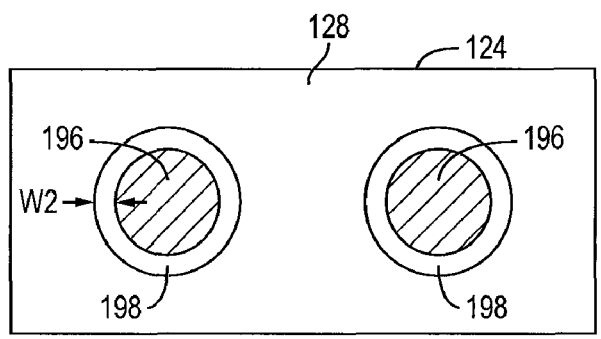

In FIG. 12c, after filling vias 194 with conductive material to form conductive TSV 196, vias 198 are formed from back surface 128 through semiconductor die 124 and insulating layer 132 using laser drilling, mechanical drilling, or DRIE with mask. In particular, vias 198 are formed around a periphery or outside of conductive TSV 196 as an annular hole extending down to insulating layer 132 and terminating at active surface 130, as shown in FIG. 12d. In one embodiment, vias 198 have a width W2 of 10-25 µm between conductive TSV 196 and base semiconductor material 122.

Figure 12E:
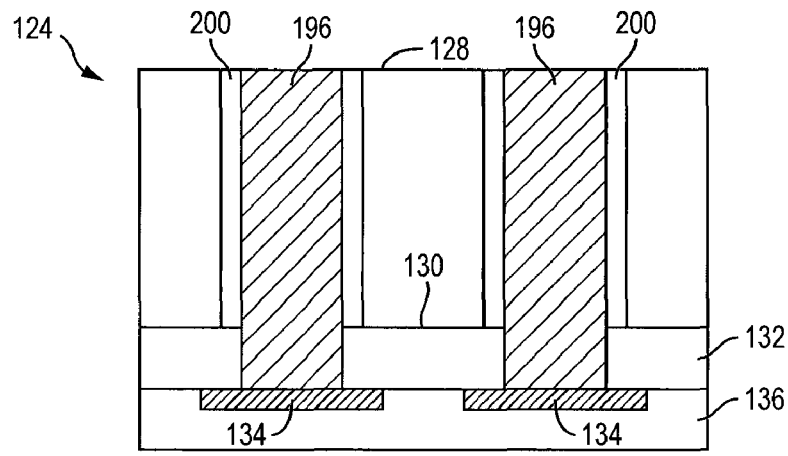

In FIG. 12e, an insulating or dielectric material is deposited into vias 198 using PVD, CVD, screen printing, sintering, or thermal oxidation to form an insulating annular ring 200. The insulating material can be one or more layers of SiO2, Si3N4, SiON, Ta2O5, Al2O3, polyimide, BCB, PBO, or other suitable dielectric material.

Figure 12F:
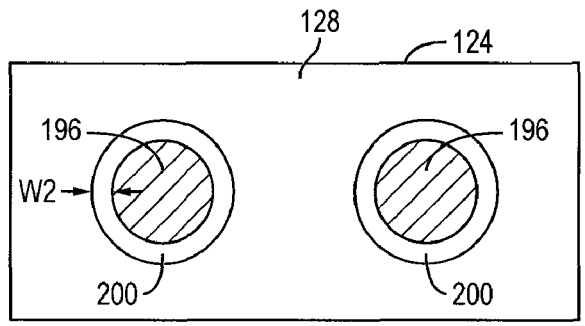

FIG. 12f shows a plan view of insulating annular ring 200 formed around the periphery or outside of conductive TSV 196. The insulating annular ring 200 has a low k to electrically isolate conductive TSV 196 with low contact resistance and low capacitance. The low-k insulating annular ring 200 reduces thermal and mechanical stress on conductive TSV 196. In addition, there is no insulating material residue or need to clean the TSV contact area of conductive layer 134 after forming insulating annular ring 200 because conductive TSV 196 has already been formed over conductive layer 134. Forming conductive TSV 196 prior to forming insulating annular ring 200 saves manufacturing cost. The insulating annular ring 200 can be formed with substantially no voids.

FIGS. 13a-13f illustrate another embodiment of the conductive TSV with an insulating annular ring. A plurality of vias 204 is formed from back surface 128, opposite active surface 130, through semiconductor die 124 to conductive layer 138 while in wafer form, see FIG. 6c, using laser drilling, mechanical drilling, or DRIE with mask, as shown in FIG. 12a. In one embodiment, vias 204 have a diameter or width W1 of 50-80 µm.

Figure 13A:
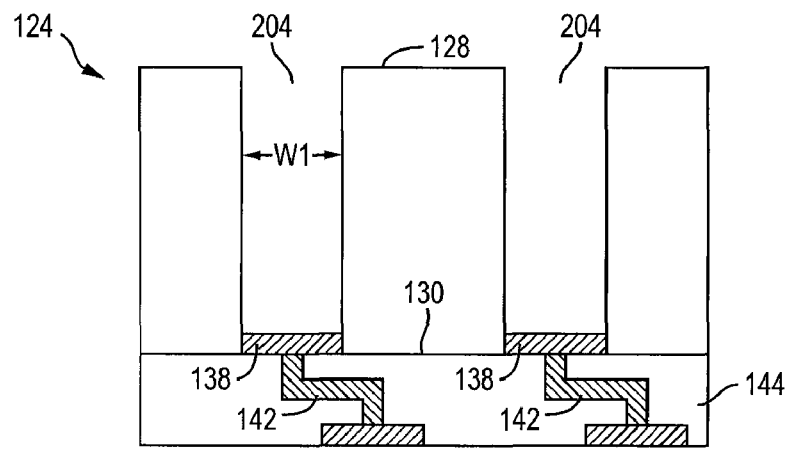
FIGS. 13a-13f illustrate a conductive TSV with an insulating annular ring over a build-up interconnect layer.
Figure 13B:
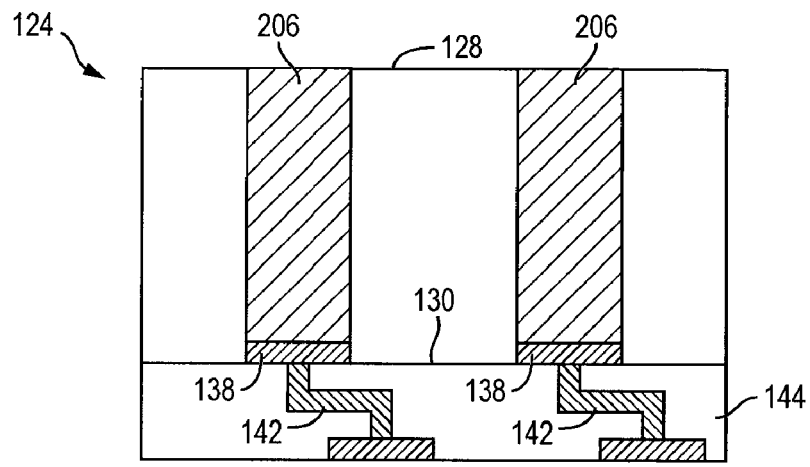

In FIG. 13b, vias 204 are filled with Al, Cu, Sn, Ni, Au, Ag, Ti, W, or other suitable electrically conductive material using electrolytic plating, electroless plating process, or other suitable metal deposition process to form z-direction vertical conductive TSV 206. Conductive TSV 206 is electrically connected to conductive layer 138.

Figure 13C:
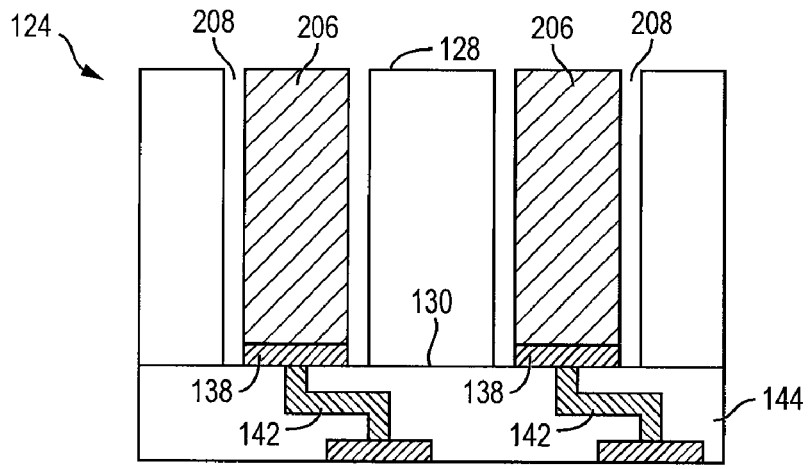
Figure 13D:
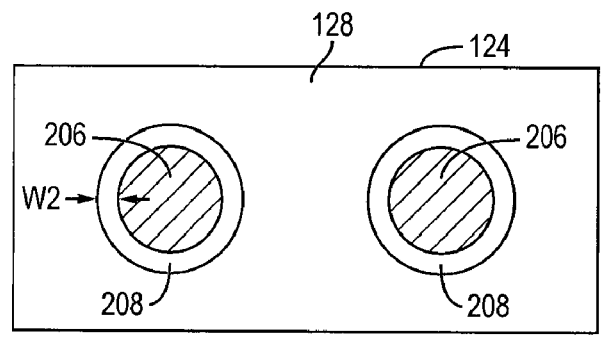

In FIG. 13c, after filling vias 204 with conductive material to form conductive TSV 206, vias 208 are formed from back surface 128 through semiconductor die 124 using laser drilling, mechanical drilling, or DRIE with mask. In particular, vias 208 are formed around a periphery or outside of conductive TSV 206 as an annular hole extending down to conductive layer 138 and terminating at active surface 130, as shown in FIG. 13d. In one embodiment, vias 208 have a width W2 of 10-25 µm between conductive TSV 206 and base semiconductor material 122.

Figure 13E:
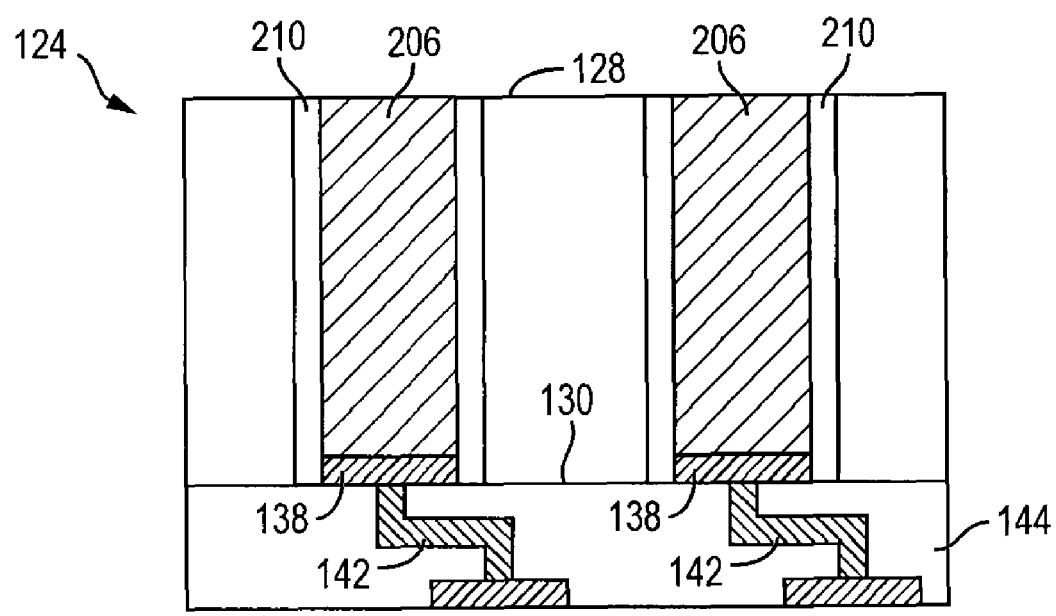

In FIG. 13e, an insulating or dielectric material is deposited into vias 208 using PVD, CVD, screen printing, sintering, or thermal oxidation to form an insulating annular ring 210. The insulating material can be one or more layers of SiO2, Si3N4, SiON, Ta2O5, Al2O3, polyimide, BCB, PBO, or other suitable dielectric material.

Figure 13F:
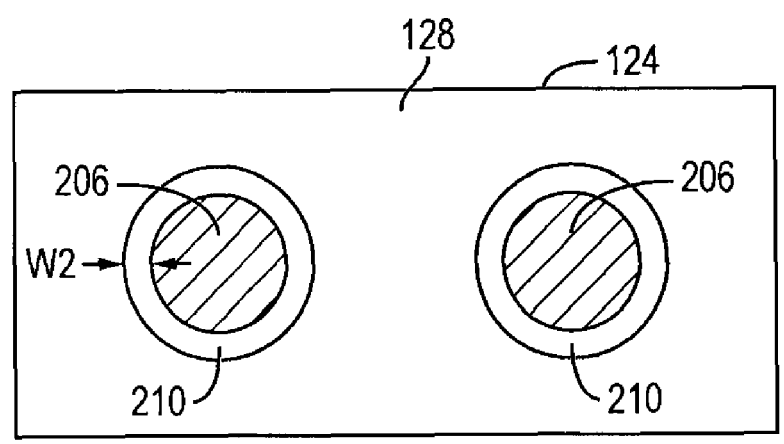

FIG. 13f shows a plan view of insulating annular ring 210 formed around the periphery or outside of conductive TSV 206. The insulating annular ring 210 has a low k to electrically isolate conductive TSV 206 with low contact resistance and low capacitance. The low-k insulating annular ring 210 reduces thermal and mechanical stress on conductive TSV 206. In addition, there is no insulating material residue or need to clean the TSV contact area of conductive layer 138 after forming insulating annular ring 210 because conductive TSV 206 has already been formed over conductive layer 134. Forming conductive TSV 206 prior to forming insulating annular ring 210 saves manufacturing cost. The insulating annular ring 210 can be formed with substantially no voids.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer;
   forming a conductive layer over the semiconductor wafer;
   forming a first via through the semiconductor wafer to the conductive layer;
   depositing a conductive material in the first via to form a conductive through silicon via (TSV);
   after forming the conductive TSV, forming a second via around the conductive TSV through the semiconductor wafer to the conductive layer; and
   depositing a first insulating material in the second via to form an insulating annular ring.

2. The method of claim 1, further including depositing a second insulating material in the first via to form an insulating core within the conductive TSV.

3. The method of claim 1, further including removing a portion of the conductive TSV to a level below a surface of the semiconductor wafer.

4. The method of claim 1, wherein the conductive TSV extends above a surface of the semiconductor wafer.

5. The method of claim 1, wherein a width of the conductive TSV is less than a width of the insulating annular ring.

6. The method of claim 1, wherein a width of the conductive TSV is greater than a width of the insulating annular ring.

7. A method of making a semiconductor device, comprising:
   providing a semiconductor wafer;
   forming a first via through the semiconductor wafer;
   depositing a conductive material in the first via to form a conductive via;
   after forming the conductive via, forming a second via around the conductive via through the semiconductor wafer; and
   depositing a first insulating material in the second via to form an insulating ring.

8. The method of claim 7, further including:
   forming an insulating layer over the semiconductor wafer; and
   forming a conductive layer over the insulating layer.

9. The method of claim 8, wherein the conductive via and insulating ring extend to the conductive layer.

10. The method of claim 7, wherein the insulating ring terminates at a surface of the semiconductor wafer.

11. The method of claim 7, further including depositing a second insulating material in the first via to form an insulating core within the conductive via.

12. The method of claim 7, further including removing a portion of the conductive via to a level below a surface of the semiconductor wafer.

13. The method of claim 7, wherein the conductive via extends above a surface of the semiconductor wafer.

14. A method of making a semiconductor device, comprising:
   providing a semiconductor die;
   forming a first via through the semiconductor die;
   depositing a conductive material in the first via to form a conductive via;
   forming a second via outside the conductive via through the semiconductor die; and
   depositing a first insulating material in the second via to form an insulating ring.

15. The method of claim 14, further including:
   forming an insulating layer over the semiconductor die; and
   forming a conductive layer over the insulating layer.

16. The method of claim 15, wherein the conductive via and insulating ring extend to the conductive layer.

17. The method of claim 14, wherein the insulating ring terminates at a surface of the semiconductor die.

18. The method of claim 14, further including depositing a second insulating material in the first via to form an insulating core within the conductive via.

19. The method of claim 14, further including removing a portion of the conductive via to a level below a surface of the semiconductor die.

20. The method of claim 14, wherein the conductive via extends above a surface of the semiconductor die.

21. A semiconductor device, comprising:
   a semiconductor die;
   a conductive via formed through the semiconductor die including an annular opening formed around the conductive via; and
   an insulating material deposited in the annular opening around the conductive via.

22. The semiconductor device of claim 21, wherein the insulating ring terminates at a surface of the semiconductor die.

23. The semiconductor device of claim 21, further including an insulating core within the conductive via.

24. The semiconductor device of claim 21, wherein the conductive via is recessed below a surface of the semiconductor die.

25. The semiconductor device of claim 21, wherein the conductive via extends above a surface of the semiconductor die.

* * * * *